(12) United States Patent
Weber et al.

(10) Patent No.: US 8,288,230 B2
(45) Date of Patent: Oct. 16, 2012

(54) METHOD FOR PRODUCING A GATE ELECTRODE STRUCTURE

(75) Inventors: Hans Weber, Bayerisch Gmain (DE); Stefan Gamerith, Viallach (AT); Roman Knoefler, Villach (AT); Kurt Sorschag, Villach (AT); Anton Mauder, Kolbermoor (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 12/894,141

(22) Filed: Sep. 30, 2010

(65) Prior Publication Data

US 2012/0083081 A1    Apr. 5, 2012

(51) Int. Cl.
 *H01L 21/336* (2006.01)
(52) U.S. Cl. .................. 438/270; 438/700; 257/E21.41; 257/E21.419
(58) Field of Classification Search .................. 438/270, 438/700; 257/E21.41, E21.419
See application file for complete search history.

(56) References Cited

U.S. PATENT DOCUMENTS

| 6,444,528 | B1 * | 9/2002 | Murphy ......................... 438/270 |
| 7,345,338 | B1 * | 3/2008 | Han et al. ...................... 257/330 |
| 2009/0053869 | A1 * | 2/2009 | Hirler ............................ 438/270 |
| 2010/0264486 | A1 * | 10/2010 | Denison et al. ............... 257/330 |

FOREIGN PATENT DOCUMENTS

WO    2007012490 A2    1/2007

* cited by examiner

*Primary Examiner* — Julia Slutsker (74) *Attorney, Agent, or Firm* — Murphy, Bilak & Homiller, PLLC (57) ABSTRACT

A transistor with a gate electrode structure is produced by providing a semiconductor body with a first surface, and with a first sacrificial layer extending in a vertical direction of the semiconductor body from the first surface. A first trench extending from the first surface into the semiconductor body is formed by removing the sacrificial layer in a section adjacent the first surface. A second trench is formed by isotropically etching the semiconductor body in the first trench. A third trench is formed below the second trench by removing at least a part of the first sacrificial layer below the second trench. A dielectric layer is formed which at least covers sidewalls of the third trench and which only covers sidewalls of the second trench. A gate electrode is formed on the dielectric layer in the second trench. The gate electrode and dielectric layer in the second trench form the gate electrode structure.

21 Claims, 11 Drawing Sheets

METHOD FOR PRODUCING A GATE ELECTRODE STRUCTURE

FIELD OF THE INVENTION

Embodiments of the present invention relate to a method for producing a transistor, like a MOSFET, in particular to a method for forming a gate electrode structure in a transistor, and in particular to a method for producing a gate electrode structure of a transistor which besides a gate electrode includes a drift control region adjacent a drift region.

BACKGROUND

A specific type of MOSFET (metal-oxide-semiconductor field effect transistor) is known which includes a gate electrode structure with a gate electrode and a gate dielectric, and includes a drift control structure with a drift control region and a drift control region dielectric. The gate structure is arranged adjacent a body region of the MOSFET, and the drift control structure is arranged adjacent a drift region. This type of MOSFET can be switched on and off like a conventional MOSFET. When it is switched on (is in its on-state), the gate electrode is biased such that a first conducting channel extends along the gate dielectric in the body region, and the drift control region is biased such that a second conducting channel extends along the drift control region dielectric in the drift region. The drift control structure helps to reduce the on-resistance of the MOSFET at a given doping concentration of the drift region, compared with conventional components which do not include such drift control region.

Ideally, the gate structure and the gate control structure are arranged such that—when the component is in its on-state—the second conducting channel adjoins the first conducting channel. In this case, the on-resistance is further improved. There is, therefore, a need for producing a gate electrode structure of a MOSFET aligned with a drift control structure.

SUMMARY

A first embodiment relates to a method for producing a transistor with a gate electrode structure. The method includes: providing a semiconductor body with a first surface, and with a first sacrificial layer extending in a vertical direction of the semiconductor body from the first surface; forming a first trench extending from the first surface into the semiconductor body, wherein forming the first trench comprises removing the sacrificial layer in a section adjacent the first surface; and forming a second trench by isotropically etching the semiconductor body in the first trench. The method further includes forming a third trench below the second trench by: removing at least a part of the sacrificial layer below the second trench; forming a dielectric layer which completely fills the third trench and which covers sidewalls of the second trench; and forming a gate electrode on the dielectric layer in the second trench. The gate electrode and the dielectric layer in the second trench form the gate electrode structure.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Embodiments described herein relate to a method for producing a gate electrode structure. The methods are explained in a specific context, namely in the context of producing a gate electrode structure of a transistor, in particular a MOSFET, which besides a gate electrode structure also includes a drift control structure with a drift control region and a drift control region dielectric. However, the methods illustrated hereinafter can also be applied to producing a gate electrode structure in other types of MOSFET components.

FIGS. 1A to 1F schematically illustrate a first embodiment of a method for producing a gate electrode structure in a semiconductor body 100. The semiconductor body 100 has a first surface 101. FIGS. 1A to 1F show vertical cross sections through the semiconductor body 100 in a vertical section plane, which is a section plane extending perpendicular to the first surface 101. In FIGS. 1A to 1F, as well as in the other figures described hereinafter, only a section of the semiconductor body 100 is schematically illustrated. In these figures a line designated with reference character 101 represents the first surface of the semiconductor body. However, the other lines do not necessarily represent other surfaces of the semiconductor body. In particular, the lines running perpendicular to the line representing the first surface 101 do not necessarily represent edge surfaces of the semiconductor body 100, and the line opposite to the line representing the first surface 101 does not necessarily represent a second surface opposite to the first surface of 101 the semiconductor body.

Figure 1A:
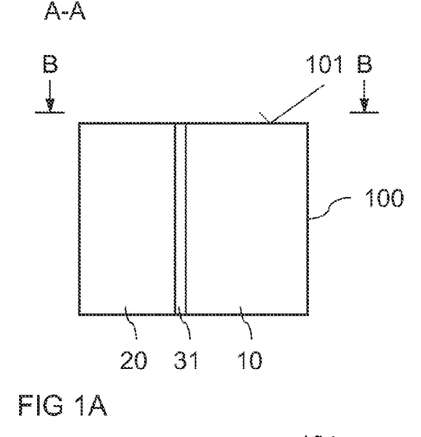
FIGS. 1A to 1F illustrate vertical cross sections through a semiconductor body during steps of a first method for producing a gate electrode structure.

Referring to FIG. 1A, the semiconductor body 100 includes a first sacrificial layer which from the first surface 101 extends in a vertical direction of the semiconductor body 100. While the first sacrificial layer 31 in the embodiment illustrated in FIG. 1A extends exactly perpendicular to the first surface 101, in accordance with the present disclosure "a sacrificial layer which extends in a vertical direction of the semiconductor body" also includes those first sacrificial layers 31 which extend in a direction that has an angle other than 90° relative to the first surface 101.

The semiconductor body 100 is, for example, a monocrystalline semiconductor body, so that first and second semiconductor regions 10, 20 adjoining the first sacrificial layer 31 in a lateral direction are monocrystalline semiconductor regions. The semiconductor material of the semiconductor body 100 can be a conventional semiconductor material, like silicon. Generally, any material which can be removed or etched selectively relative to the semiconductor body 100 is suitable for implementing the first sacrificial layer 31. The first sacrificial layer 31 is, for example, an oxide layer, like an $SiO_2$ layer, a nitride layer, like an $Si_3N_4$ layer, a carbon (C) layer, or a germanium (Ge) containing layer, like a silicon-germanium layer with a high Ge concentration. Also composite layers with several sub-layers can be used, like a composite layer including an oxide layer and a carbon layer. Between the individual layers of such composite layer thin intermediate layers of a semiconductor material, like silicon can be used, wherein the intermediate layer may include a thickness of only several atoms. According to one embodiment a composite first sacrificial layer has the following sequence of sub-layers: SiO2—(Si)—C—(Si)—C, wherein the Si-layers are optional (and therefore written in parentheses) and may include only several atom layers each.

Various methods are known for producing a sacrificial layer, like sacrificial layer 31 illustrated in FIG. 1A, in a semiconductor body, like the semiconductor body 100 according to FIG. 1A. One of these methods includes: forming a trench in a semiconductor body; producing a sacrificial layer at least on one sidewall of the trench; and filling the trench by epitaxially growing a semiconductor material on the bottom of the trench and/or on those sidewalls of the trench not covered by a sacrificial layer. These methods, however, are known so that no further explanations are required in this regard.

Figure 1B:
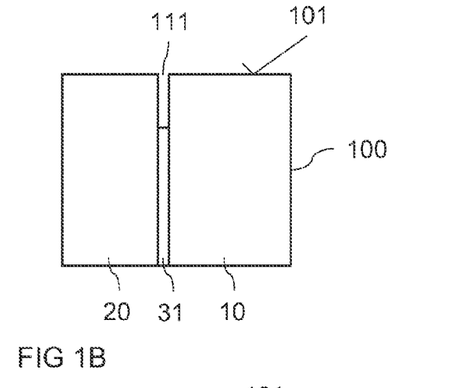

Referring to FIG. 1B, a first trench 111 which extends from the first surface 101 into the semiconductor body 100 is formed. In the embodiment illustrated in FIG. 1B, forming the first trench 111 only includes removing the sacrificial layer 31 in a section adjacent the first surface 101. Forming the first trench may, however, also include more complex methods, which will be explained herein further below. Removing the first sacrificial layer 31 in the section adjacent the first surface 101 includes, for example, an etching process which etches the first sacrificial layer 31 selectively against the material of the semiconductor body 100. The depth of the first trench 111 is, for example, defined by the duration of the etching process.

"Etching the first sacrificial layer 31 selectively" relative to the semiconductor body 100 in this context means that the etching medium used for etching the first sacrificial layer 31 etches the material of the first sacrificial layer 31 at an etch rate which is significantly higher (e.g. higher than a factor of 5, preferably higher than a factor of 20) than the etch rate at which the etching medium etches the semiconductor material of the semiconductor body 100. In other words: When the first sacrificial layer 31 is etched, also a part of the semiconductor body 100 can be removed. However, this removed part of the semiconductor body 100 has a significantly smaller volume than the first sacrificial layer 31.

Figure 1C:
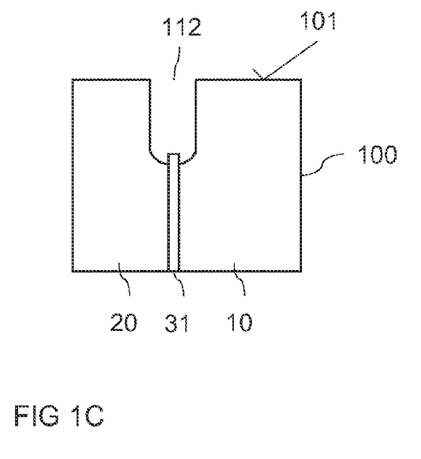

Referring to FIG. 1C a second trench 112 is formed by isotropically etching the semiconductor body 100 in the first trench 111, i.e. by widening the first trench. In this etching process material of the semiconductor body 100 is removed starting from the sidewalls of the first trench 111. In this method also semiconductor material at the first surface 101 can be removed, which is not explicitly illustrated in FIG. 1C. The etching medium used in this process etches the material of the semiconductor body 100 selectively relative to the material of the first sacrificial layer 31. "Etching the material of the semiconductor body 100 selectively" relative to the material of the first sacrificial layer 31 means that the etching medium used for etching the semiconductor body 100 etches the semiconductor body 100 at an etching rate which is significantly higher (e.g. higher than a factor of 5 or even 10) than the etching rate at which the etching medium etches the first sacrificial layer 31. As a result a remainder of the first sacrificial layer 31 extends into the second trench 112 as shown in FIG. 1C.

Figure 1D:
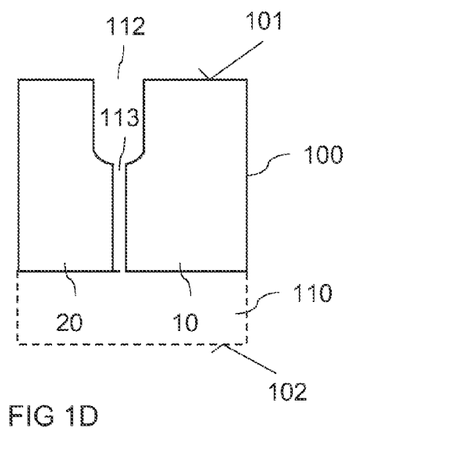

In next method steps, the result of which is illustrated in FIG. 1D, a third trench 113 is formed below the second trench 112. This first trench is formed by removing at least a part of the first sacrificial layer 31 below the second trench 112. According to one embodiment the sacrificial layer 31 is completely removed below the second trench 112. Partly or completely removing the sacrificial layer 31 below the second trench 112 may include an etching process which etches the material of the first sacrificial layer 31 selectively, i.e. much faster, e.g. by a factor of 20 or more, preferably by a factor of 100 or more, than the material of the semiconductor body 100.

The first sacrificial layer 31 is arranged in the semiconductor body 100 such that the semiconductor body 100 is not separated or split into two pieces, even when the sacrificial layer 31 is completely removed when forming the third trench 113. According to one embodiment, which is illustrated in dashed lines in FIG. 1D, the first sacrificial layer 31 in a vertical direction of the semiconductor body 100 does not extend completely through the semiconductor body 100 to a second surface 102 which is opposite to the first surface 101. In this embodiment, even when the first sacrificial layer 31 is completely removed, there is still a continuous material section, e.g. a dielectric and/or semiconductor section and/or a section of the semiconductor body 100, below the third trench 113, which prevents the semiconductor body 100 from being separated into different pieces. This continuous material section is illustrated by the dashed lines in FIG. 1D.

Figure 1E:
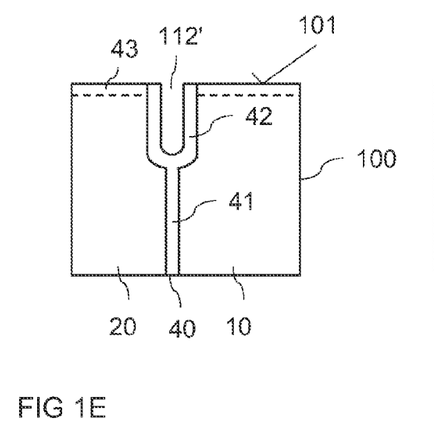

Referring to FIG. 1E, a dielectric layer 40 is then formed in the third trench 113 and along a bottom and the sidewalls of the second trench 112. The dielectric layer 40 completely fills the third trench 113, and only covers the bottom and the sidewalls of the second trench 112, so that a residual trench 112' remains after forming the dielectric layer 40. The dielectric layer 40 is, for example, an oxide layer. This oxide layer can be formed by a thermal oxidation process, by a deposition process, or by a combined process including a thermal oxidation and a deposition process. According to one embodiment, a thin thermal oxide is formed along the sidewalls of the third trench 113. The remaining trench is the filled with an oxide, like $SiO_2$, or a nitride, like $Si_3N_4$, with is conformly deposited in the trench, for example by a CVD (chemical vapor deposition) process. Optionally, a thermal oxidation process follows the deposition process. Alternatively, the remaining trench is filled with a semiconductor material which is then thermally oxidized.

According to a further embodiment the dielectric layer 40 includes a layer stack with a plurality of at least two different dielectric layers which are formed one above the other on the sidewalls of the second and the third trench 112, 113, wherein this layer stack partially or completely fills the third trench 113.

The dielectric layer 40 includes two sections: A first section 41 arranged in the third trench 113; and a second section 42 arranged along the bottom and the sidewalls of the second trench 112. The dielectric layer 40 can also include a third section 43 which is arranged along the first surface 101. This third section 43 is formed, when the first surface 101 during the process of forming the dielectric layer 40 is uncovered. However, it is also possible to cover the first surface 101 during the process of forming the dielectric layer 40 with a protection layer which prevents the third section 43 of the dielectric layer 40 from being formed.

Figure 1F:
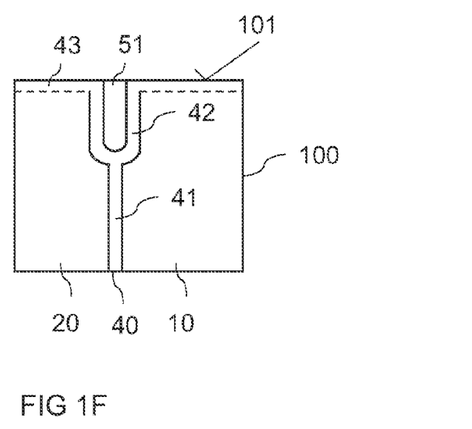

Referring to FIG. 1F, an electrode layer which forms a gate electrode 51 is deposited on the dielectric layer 42 in the residual trench 112'. The electrode 51 includes, for example, a polycrystalline semiconductor material, such as n-doped or p-doped polysilicon, or a metal.

In the embodiment illustrated in FIG. 1F, the electrode layer completely fills the residual trench 112'. However, this is only an example. According to a further embodiment the electrode layer only covers the dielectric layer 42 in the residual trench 112', so that a further residual trench remains. This further residual trench then can be filled with a filling material, like an insulation material or a dielectric material. According to another embodiment, the electrode 51 in the residual trench 112' includes two or more electrode layers which are deposited one above the other and which are comprised of the same electrode material or of different electrode materials. A layer stack with the different electrode layers may completely fill the residual trench 112', or may leave a further residual trench, which is then filled with a filling material, like a dielectric or an insulator.

After the filling process, the residual trench 112' is either completely filled with an electrode and/or a filling material, or there may remain certain gaps or voids buried in the electrode or filling material. Such voids or gaps, however, can be tolerated.

The optional third section 43 of the dielectric layer 40 can be removed before or after forming the electrode 51. During the process steps of filling the residual trench 112' electrode or filling material can be deposited on the third section 43 of the dielectric layer or on the first surface 101 of the semiconductor body. This material can also be removed after forming the electrode 51, wherein this material can be removed together with the optional third section 43 of the dielectric layer. This removal process or these removal processes can, for example, include a polishing method, such as a CMP-method (CMP=chemical-mechanical polishing). Alternatively, the dielectric material and/or the electrode or filling is removed using an isotropic recess etching leaving the electrode 50 material and/or dielectric layer 40 in the trench, e.g. with a small dip below the first surface 101, but completely removing the layer from the first surface 101.

According to a further embodiment, a part of the electrode 50 is removed from the upper part of the residual trench 112', thereby forming a trench above the electrode 50. This trench can now be filled with various other materials. According to one embodiment, a capacitive structure including two electrodes insulated from each other can be formed in this trench.

The structure with the electrode 51 and the second section 42 of the dielectric layer 40 can be used as a gate electrode structure in a MOSFET, with the electrode 51 forming a gate electrode, and the dielectric layer 42 forming a gate dielectric. Use of such gate electrode structure in a MOSFET will be explained further in detail hereinafter with reference to FIGS. 4 to 7.

Figure 2A:
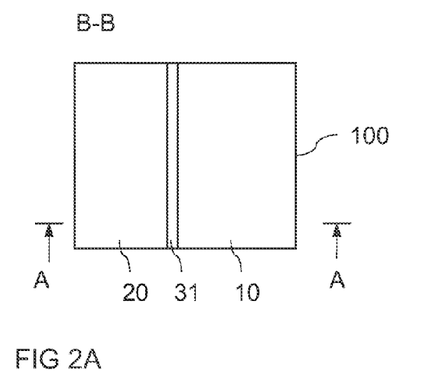
FIGS. 2A and 2B illustrate top views of a semiconductor body in which a longitudinal sacrificial layer is arranged before and after performing the method illustrated in FIGS. 1A to 1F.
Figure 2B:
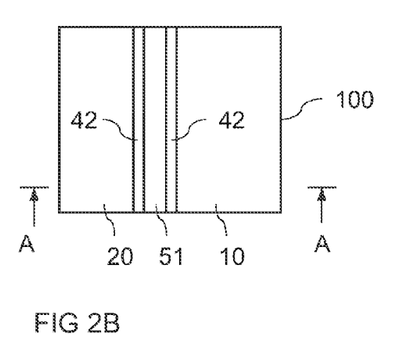

In the horizontal plane—which is the plane of the first surface 101 or a plane parallel to the first surface—the gate electrode structure can be produced with different geometries. Referring to FIGS. 2A and 2B which each show a top view on the semiconductor body 100, the gate electrode structure can be produced with a longitudinal geometry in the horizontal plane. FIG. 2B shows a top view on such gate electrode structure with a longitudinal geometry. This gate electrode structure is obtained by applying the method steps illustrated in FIGS. 1A to 1F on a semiconductor body according to FIG. 2A which includes a first sacrificial layer 31 which extends longitudinally in the horizontal plane of the semiconductor body 100.

Figure 3A:
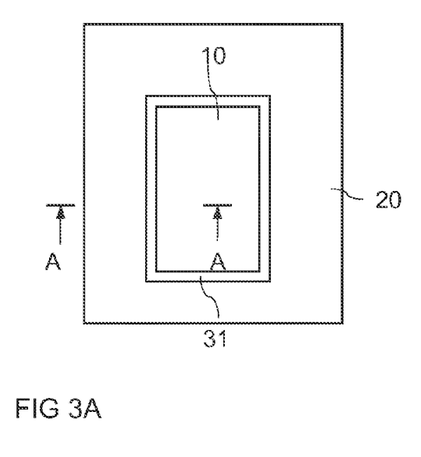
FIGS. 3A and 3B illustrate top views of a semiconductor body in which a ring-shaped sacrificial layer is arranged before and after performing the method illustrated in FIGS. 1A to 1F.
Figure 3B:
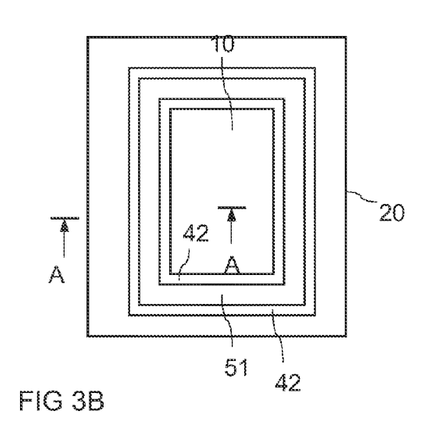

According to FIG. 3B the gate electrode structure could also be implemented with a ring-shaped geometry, in particular, the geometry of a rectangular ring. FIG. 3B shows a top view on a semiconductor body 100 with an integrated gate electrode structure which has the geometry of a rectangular ring in the horizontal plane of the semiconductor body 100. Such gate electrode structure with a ring-shaped geometry can be obtained by applying the method steps illustrated in FIGS. 1A to 1F on a semiconductor body 100 with a first sacrificial layer 31 that has a ring-shaped geometry in the horizontal plane of the semiconductor body 100. A first sacrificial layer 31 with a ring-shaped geometry is illustrated in FIG. 3A. A first sacrificial layer 31 with a ring-shaped geometry can, for example, be produced by: producing a trench 10 which in the horizontal plane has a rectangular cross section in the semiconductor body 100; forming the first sacrificial layer 31 along the sidewalls of the trench 10; and filling the trench 10 by epitaxially growing a semiconductor material from the bottom of the trench.

Figure 4A:
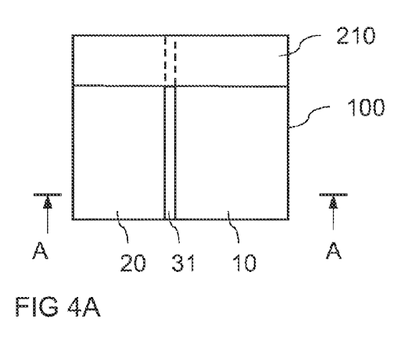
FIGS. 4A and 4B illustrate a modification of the method illustrated in FIGS. 1A to 1F.
Figure 4B:
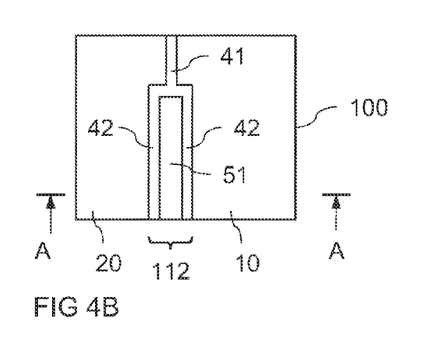

Although FIGS. 2A, 2B and 3A, 3B show that the gate electrode structure is produced along the complete length of the first sacrificial layer 31, it should be noted that this is only an example. Referring to FIGS. 4A and 4B the gate electrode structure can be produced selectively only at selected positions along the first sacrificial layer 31. Referring to FIG. 4A sections where no gate electrode structures should be produced can be covered with a mask layer 210 on top of the first surface 101 of the semiconductor body 100, while those sections in which a gate electrode structure is to be produced are uncovered. The mask layer 210 protects the first sacrificial layer 31 during the method step illustrated in FIG. 1B in which the first sacrificial layer 31 is partly removed in order to form the first trench 111. The mask layer 210 can remain on the first surface 111 until the gate electrode structure is completely produced. However it is also possible to remove the mask layer 210 after forming the first trench 111 in those regions of the sacrificial layer 31 not covered by the mask layer 210. It should be noted that, depending on the used etching process for locally removing the first sacrificial layer 31, the vertical dimension of the resulting trench 112 at the edge of the mask layer 210 can be influenced. In case of an anisotropic etching process for partially removing the sacrificial layer 31, the resulting trench 112 will reach to the edge of the mask layer and will have an essentially homogeneous depth in the vertical direction. In case of an isotropic etching process, for removing the sacrificial layer 31 the resulting trench 112 will reach under the edge of the mask layer 210 and will show a depth that is gradually decreasing from the edge of the mask layer 210 until it reaches the surface of the semiconductor body 100.

Figure 5:
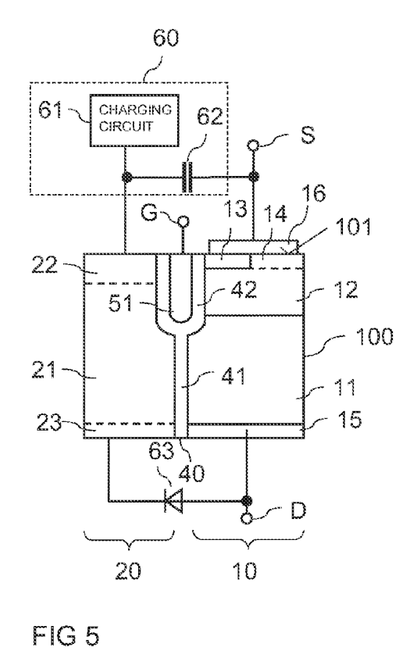
FIG. 5 illustrates a vertical cross section through a semiconductor component which includes a gate electrode structure produced in accordance with the method illustrated in FIGS. 1A to 1F.

FIG. 5 schematically illustrates a cross section through a transistor according to a first embodiment which includes a gate electrode structure produced in accordance with the method illustrated in FIGS. 1A to 1F. The transistor is implemented as a MOSFET, but could also be implemented as an IGBT (insulated gate bipolar transistor). The MOSFET includes a body region 12 arranged adjacent the gate dielectric 42 in the first semiconductor region 10, and a source region 13 arranged within the body region 12 and contacted by a source electrode 16. The source electrode 16 also contacts the body region 12, wherein optionally a higher-doped semiconductor region 14 of the same doping type as the body region 12 is arranged between the body region 12 and the source electrode 16. The MOSFET further includes a drift region 11 which in the vertical direction of the semiconductor body 100 adjoins the body region 12 and in a lateral direction of the semiconductor body 100 is arranged adjacent the first section 41 of the dielectric layer 40. The MOSFET further includes a drain zone 15 which is arranged adjacent the drift region 11 in the vertical direction of the semiconductor body 100 and which is connected to a drain terminal D (schematically illustrated in FIG. 5). The gate electrode 51 is connected to a gate terminal G.

Besides the gate electrode structure, the MOSFET includes a drift control structure with a drift control region (DCR) 21 and a drift control region dielectric (DCR dielectric) 41 arranged adjacent the DCR 21 in the lateral direction of the semiconductor body 100. The DCR dielectric 41 is formed by the first section 41 of the dielectric layer 40 and is arranged between the DCR 21 and the drift region 11. The DCR 21 is arranged in the second region 20 of the semiconductor body 100 and, like the drift region 11, includes a monocrystalline semiconductor material.

The MOSFET can be implemented as an n-type enhancement MOSFET. In this type of MOSFET the source region 13, the drift region 11 and the drain region 15 are n-doped, while the body region 12 is p-doped. The DCR 21 is either n-doped or p-doped. The MOSFET could also be implemented as a p-type enhancement MOSFET. In this case the doping types of the individual semiconductor regions are complementary to the doping type of the semiconductor regions of an n-type MOSFET.

The operating principle of the MOSFET illustrated in FIG. 5 will now be explained. For explanation purposes it is assumed that the MOSFET is an n-type MOSFET; however, the explanation applies to a p-type MOSFET accordingly. The MOSFET can be switched on and off by applying suitable drive potentials to the gate terminal G connected to the gate electrode 51. When the MOSFET is in its on-state, a first conducting channel extends along the gate dielectric 42 in the body region 12 between the source region 13 and the drift region 11. In an enhancement MOSFET, this first conducting channel in the body region 12 is an inversion channel. Further, there is a second conducting channel in the drift region 11 along the DCR dielectric 41. This second conducting channel is an accumulation channel, when the doping type of the drift region 11 is complementary to the doping type of the body region 12, and is an inversion channel, when the doping type of the drift region 11 corresponds to the doping type of the body region 12. The second conducting channel in the drift region 11 along the DCR dielectric 41 is controlled by the DCR 21. The DCR 21 is connected to a charging arrangement 60 which—in an n-type MOSFET—is configured to keep the electrical potential of the drift control region 21 above the electrical potential of the drift region 11 or even above the electrical potential of the drain region 15, when the component is in its on-state, so that there is the conducting channel in the drift region 11 along the drift control region dielectric 41.

The charging arrangement 60 includes, for example, a charging circuit 61 connected to the drift control region 21, and a charge storage element 62, like a capacitor, connected between the DCR 21 and the source electrode 16 or the source terminal S. The charging circuit 61 provides the electrical charge which is necessary for the DCR 61 to assume an electrical potential which is required for generating the second conducting channel.

When the component is in its off-state, i.e. when an electrical potential is applied to the gate terminal G which interrupts the first conducting channel in the body region 12, and when there is a voltage between the drain and source terminals D, S, a space charge region or depletion region propagates in the drift region 11. The depletion region in the drift region 11, or the electric field associated with the depletion region, causes the drift control region 21 to be also completed of charge carriers. Charge carriers that, in the on-state, are required in the drift control region 21 to control the second conducting channel in the drift region 11 are stored in the charge storage element 42 until the MOSFET is switched on for the next time. Storing the charge carriers in the charge storage element 62 has the advantage that the charging circuit 61 in each switching cycle of the MOSFET has to provide only a part of the charging required in the drift control region 21, namely that part which was subject to losses.

Referring to FIG. 5, the drift control region 21 is optionally coupled to the drain terminal D via an optional connection region 23 and/or a diode 63. The connection region 23 can be of the same doping type as the drift control region 21 but is more highly doped than the drift control region. This diode 63 in an n-type MOSFET is biased such that the electrical potential of the drift control region 21 can rise above the electrical potential of the drain terminal D. The diode 63 helps to prevent the electrical potential of the lower part of the drift control region 21 or connection region 23 from falling below the potential of the drain terminal D in an uncontrolled manner (in an n-type MOSFET). Such an uncontrolled change of the potential in parts of the drift control region 21 or connection region 23 may be caused by an electron accumulation due to thermal charge carrier generation when the MOSFET is blocking.

Charging circuits, like charging circuit 61 of FIG. 5, for charging the drift control region, like drift control region 21, in a MOSFET, are known, so that no further explanations are required in this regard. According to one embodiment, the charging circuit 61 may include a rectifier element, like a diode, connected between a gate terminal G and the drift control region 21.

Optionally in an n-type MOSFET, and when the DCR is n-doped, a p-type semiconductor region 22 is arranged between the charging arrangement 60 and the drift control region 21. In a p-type MOSFET this semiconductor region 22 is n-doped.

Since the gate dielectric 42 and the gate control dielectric 41 are formed by one dielectric layer 40 which extends in the vertical direction of the semiconductor body 100, the first and second conducting channels are formed along the same dielectric layer 40, when the component is in its on-state. Thus, there is no significant gap between these two conducting channels, which helps to reduce the on-resistance of the component.

Figure 6:
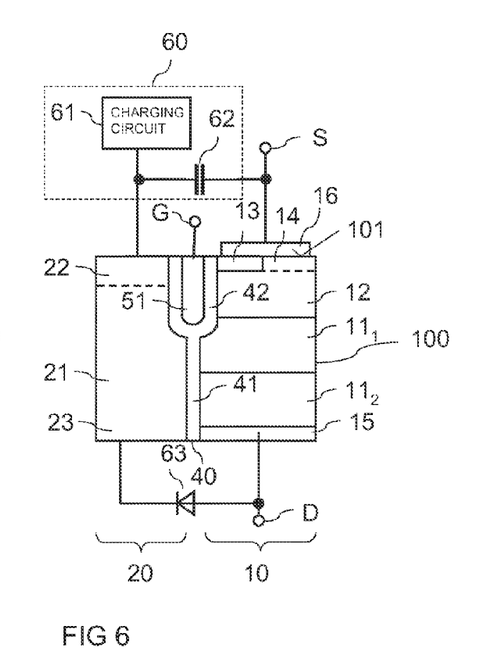
FIG. 6 illustrates a modification of the transistor component of FIG. 4.

FIG. 6 illustrates a modification of the MOSFET of FIG. 5. In the MOSFET of FIG. 6, the drift region includes two drift region sections: A first drift region section $11_1$ arranged adjacent the body region 12 in the vertical direction of the semiconductor body 100, and a second drift region section $11_2$ arranged between the first drift region section $11_1$ and the drain region 15. The first drift region section $11_1$ has the same doping type as the body region 12, and the second drift region section $11_2$ is doped complementarily to the first drift region section $11_1$. The doping concentration of the body region 12 is, for example, in the range of between $10^{16}$ cm$^{-3}$ and $10^{18}$ cm$^{-3}$, the doping concentration of the first drift region section $11_1$ is, for example, in the range of between $10^{13}$ cm$^{-3}$ and $10^{16}$ cm$^{-3}$, and the doping concentration of the second drift region section $11_2$ is, for example, in the range of between $10^{12}$ cm$^{-3}$ and $10^{15}$ cm$^{-3}$ in components having a voltage blocking capability of more than 400V. The second conducting channel built up in the drift region 10 by the potential in the drift control region 20 in this component comprises piecewise both channel types, an inversion channel and an accumulation channel. According to a further embodiment, the drift region 11 completely has the doping type of the body region 12.

Figure 7:
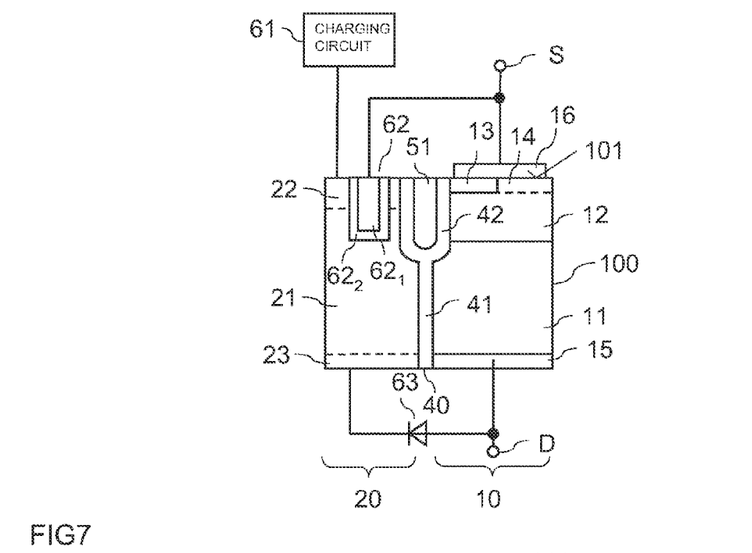
FIG. 7 illustrates a further modification of the transistor component of FIG. 4.

FIG. 7 illustrates an embodiment of the MOSFET illustrated in FIG. 5, in which the capacitive charge storage element 62 is integrated in the second semiconductor region 20. The charge storage element 62 includes a first electrode $62_1$ which is arranged in a trench extending into the second semiconductor region 20 from the first surface 101. Within the semiconductor body 100 the first electrode $62_1$ is surrounded by a capacitor dielectric $62_2$. The first electrode $62_1$ forms a first capacitor electrode. A second capacitor electrode is formed by the DCR 21 and the optional semiconductor region 22.

A plurality of first electrodes $62_1$ and capacitor dielectrics $62_2$ can be formed in the second semiconductor region 20 in order to increase the capacitance of the charge storage element 62.

The optional semiconductor region 22 may be arranged only in a part of the semiconductor region 20, e.g. only in a region forming a contact to an electrode connected to the charging circuit 61. Further, the optional semiconductor region 22 may reach deeper into the semiconductor body 100 in a vertical direction than the storage elements 62.

FIGS. 5 to 7 illustrate only one transistor cell of a MOSFET. The MOSFET may include a plurality of the transistor cells illustrated in FIGS. 5 to 7, wherein each cell includes a source, body, drift and drain region, as well as a gate electrode structure and a drift control structure. The source regions 13 of the individual transistor cells are connected together, the drain regions 15 of the individual transistor cells are connected together, and the gate electrodes 51 of the individual transistor cells are connected together. The charging circuit 61 can be common to the drift control regions 21 of the individual transistor cells. The type of transistor cells illustrated in FIGS. 5 to 7 can be referred to as "Y-cells" because of the specific geometry of the dielectric layer 40 which looks similar to the capital letter "Y".

In the Y-cell the gate electrode structure and the dielectric layer 41 below the gate electrode structure have been produced in a self-aligned manner.

Figure 8A:
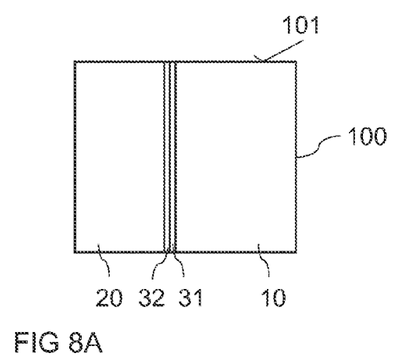
FIGS. 8A to 8F illustrate a second embodiment of a method for producing a gate electrode structure.

FIGS. 8A to 8F which show vertical cross sections of a semiconductor body 100, illustrate a modification of the method illustrated in FIGS. 1A to 1F. Referring to FIG. 8A, in this method a semiconductor body 100 includes the first sacrificial layer 31 and further includes a second sacrificial layer 32 which adjoins the first sacrificial layer 31 and which also extends in the vertical direction of the semiconductor body 100. Everything which has been discussed concerning the geometry of the first sacrificial layer 31 hereinbefore applies to the layer stack with the first and the second sacrificial layer 31, 32 accordingly.

Figure 8B:
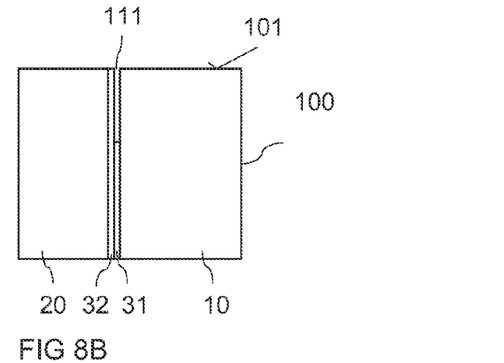

Referring to FIG. 8B, the first trench 111 is formed by removing a part of the first sacrificial layer 31. Forming the first trench 111 includes, for example, an etching process which etches the first sacrificial layer 31 selectively against the semiconductor body 100 and selectively against the second sacrificial layer 32. Sidewalls of the first trench 111 are formed by the semiconductor body 100 and the second sacrificial layer 32.

Figure 8C:
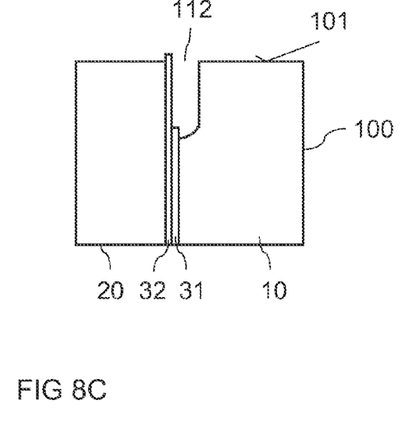

Referring to FIG. 8C, the second trench 112 is formed by isotropically etching the semiconductor body 100 in the first trench 111. In this etching process the second sacrificial layer 32 acts as a protection layer of the semiconductor body 100, so that the semiconductor body 100 is only etched at the sidewall of the first trench 111 which is opposite to the second sacrificial layer 32. Unlike the second trench 112 illustrated in FIG. 1C, the second trench 112 according to FIG. 8C is not symmetrical relative to a vertical plane defined by the first sacrificial layer 31.

Figure 8D:
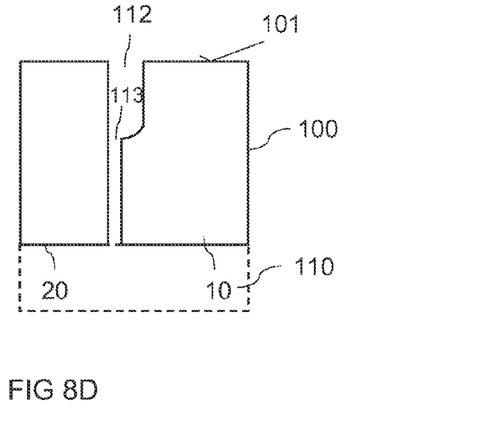
Figure 8E:
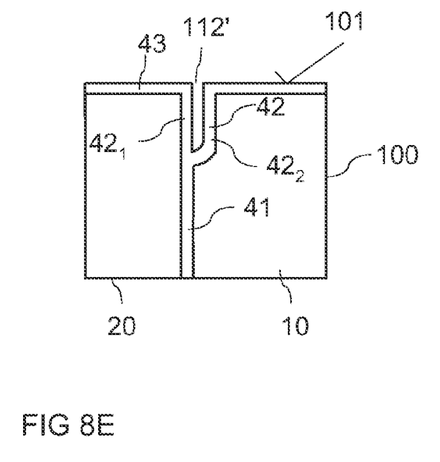

Referring to FIG. 8D a third trench 113 is formed below the second trench 112 by partly or completely removing the first sacrificial layer 31 below the second trench 112. Before removing the first sacrificial layer 31 below the second trench 112 or after removing the first sacrificial layer 31 below the second trench 112 the second sacrificial layer 32 is removed in the second and third trench 112, 113. Removing the second sacrificial layer 32 includes, for example, an etching process which etches the second sacrificial layer 32 selectively against the semiconductor body 100. The second sacrificial layer 32 includes, for example, carbon or silicon-germanium (SiGe) with a high Ge concentration. The remaining method steps correspond to the method steps that have been explained in detail with reference to FIGS. 1E and 1F. These method steps include forming the dielectric layer 40 in the third trench 113 and along the sidewalls of the second trench 112, wherein the dielectric layer 40 can completely fill the third trench 113 and only covers the sidewalls of the second trench 112, so that a residual trench 112' remains as shown in FIG. 8E; and forming the gate electrode 51 in the residual trench 112'. That which has been discussed in connection with FIGS. 1E and 1F concerning forming the dielectric layer 40 and the gate electrode 51 applies to the method according to FIGS. 8E and 8F accordingly.

Figure 8F:
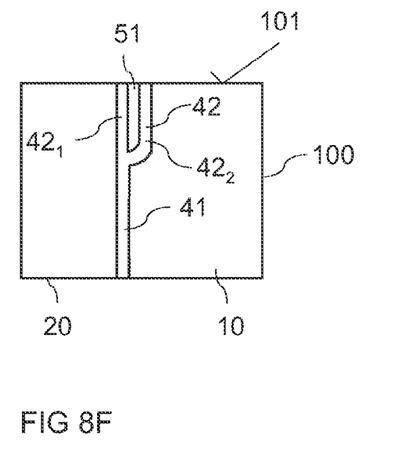

The dielectric layer 42 along the sidewalls of the second trench 112 includes two layer section: a first layer section $42_1$ adjacent the second semiconductor region 20, and a second layer section $42_2$ adjacent the first semiconductor region 10. The first section $42_1$ and the dielectric layer 41 form a longitudinal dielectric layer adjacent the second semiconductor region. According to one embodiment, an interface between this longitudinal dielectric layer and the second semiconductor region 20 is plane, i.e. does not have a step in a horizontal direction. Such a dielectric layer with a plane surface can be formed by a thermal oxidation process which is stopped as soon as the third trench 113 is completely filled. In this case, a thickness of the first section $42_1$ (and the second section $42_2$) is about half the thickness of the dielectric layer 41 in the third trench. If the oxidation process is not stopped when the third trench is completely filled, layer thicknesses of more than half the layer thickness of layer 41 can be obtained. However, this causes the first section $42_1$ to extend deeper into the second semiconductor region 20 in a horizontal direction of the semiconductor body 100, so that a step at the position where the layer 41 and section 42₁ adjoin each other is produced.

Alternatively, a thermal oxidation process is stopped before the third trench 113 is completely filled and a residual trench is filled by depositing a dielectric material. Through this, also a dielectric layer with a planar interface is produced.

Figure 9:
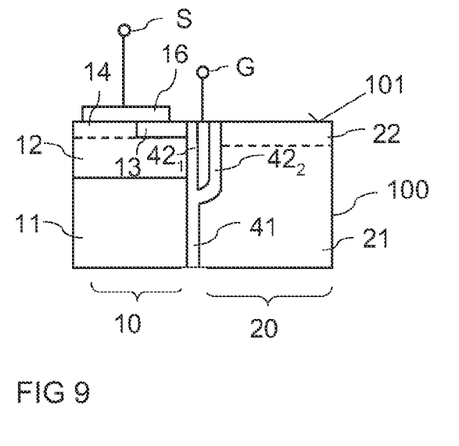
FIG. 9 illustrates a vertical cross section through a transistor component implemented with a gate electrode structure produced in accordance with the method of FIGS. 8A to 8F.
Figure 10:
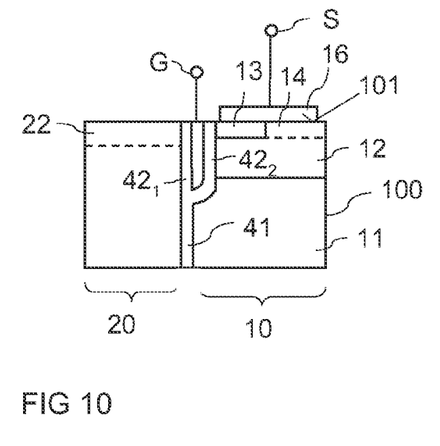
FIG. 10 illustrates a vertical cross section through a further transistor component implemented with a gate electrode structure produced in accordance with the method of FIGS. 8A to 8F.

FIGS. 9 and 10 illustrate embodiments of transistor cells implemented with a gate electrode structure produced in accordance with the method of FIGS. 8A to 8F. In FIGS. 9 and 10 only upper sections of the transistor cells are shown, i.e. those sections of the transistor cell which include the gate electrode structure. In the gate electrode structure illustrated in FIG. 8F the gate dielectric 42 has two sections: A first section 42₁ which is aligned with the section 41 of the dielectric layer 40 in the third trench; and a second section 42₂ which in the lateral direction is off that too the section 41 of the dielectric layer 40 in the third trench. The difference between the transistor cells illustrated in FIGS. 9 and 10 is that in FIG. 9 the body region 12 is adjacent the first section 42₁ of the gate dielectric, while in the embodiment according to FIG. 10 the body region 12 is adjacent the second section 42₂ of the gate dielectric. In the embodiment of FIG. 9, when the component is in its on-state, the second conducting channel is aligned with the first conducting channel.

Figure 11A:
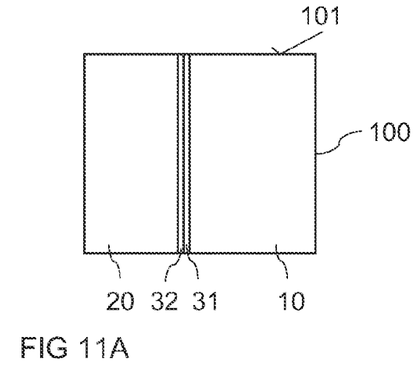
FIGS. 11A to 11G illustrate a modification of the method illustrated in FIGS. 7A to 7F.
Figure 11B:
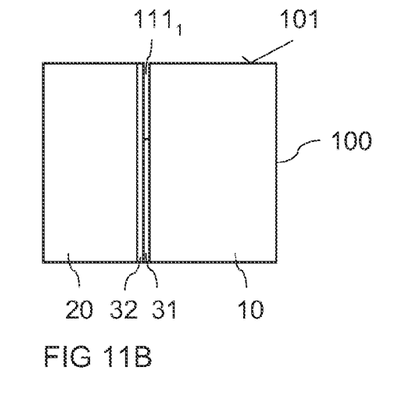
Figure 11C:
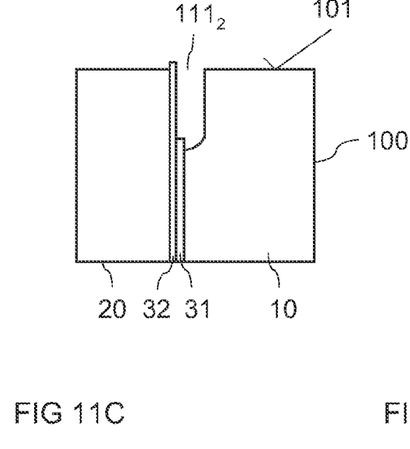
Figure 11D:
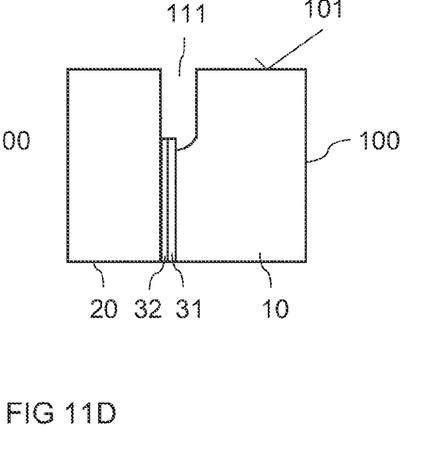

FIG. 11A to 11G illustrate a modification of the method illustrated in FIGS. 8A to 8F. In this method, forming the first trench 111 does not only include removing a part of the first sacrificial layer 31, but also includes at least one isotropically etching process. In this method, after providing the semiconductor body 100 with first and second sacrificial layers 31, 32 as shown in FIG. 11A, a first section 111₁ of the first trench 111 is formed by removing a part of the first sacrificial layer 31. Referring to FIG. 11C, the semiconductor body 100 is then isotropically etched in the first section 111₁ of the first trench, wherein the second sacrificial layer 32 protects the semiconductor body 100 from being etched. This forms a second section 111₂ of the first trench. Then, referring to FIG. 11D, the second sacrificial layer 32 is removed in the second section 111₂ which results in the first trench 111.

Figure 11E:
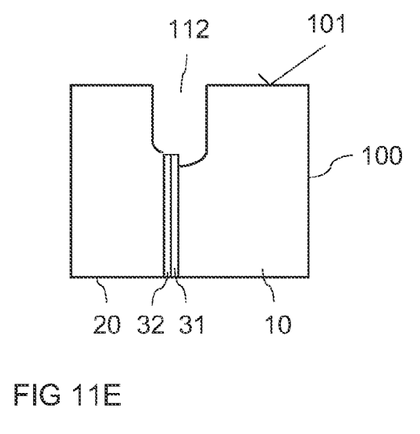
Figure 11F:
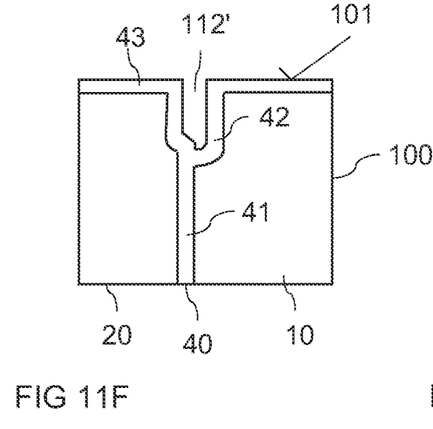
Figure 11G:
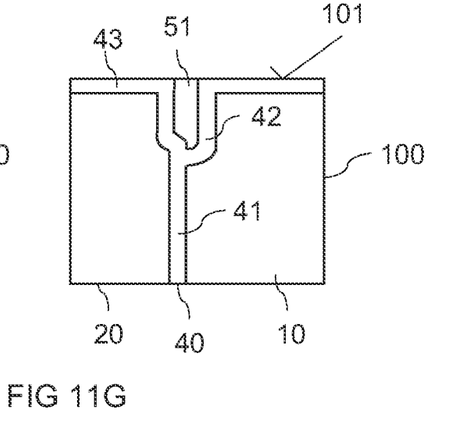

Referring to FIG. 11E, the semiconductor body 100 is isotropically etched in the first trench 111 in order to form the second trench 112. The remaining method steps correspond to the method steps illustrated in FIGS. 1E and 1F or FIGS. 8E and 8F. These method steps include: removing the first and the second sacrificial layers 31, 32 below the second trench 112 in order to form the third trench 113; forming the dielectric layer 40 in the third trench 113 and along the sidewalls of the second trench 112, as well as optionally below the first surface 101 as shown in FIG. 11E; and forming the gate electrode 51 as shown in FIG. 11G.

Figure 12A:
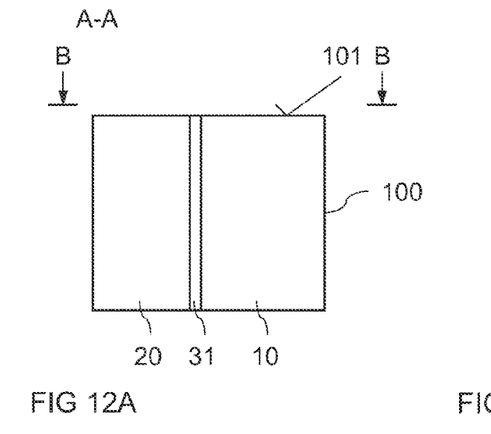
FIGS. 12A to 12H illustrate a modification of the method illustrated in FIGS. 1A to 1F.
Figure 12B:
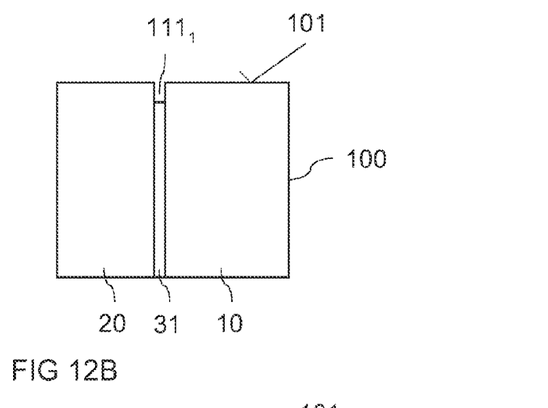
Figure 12C:
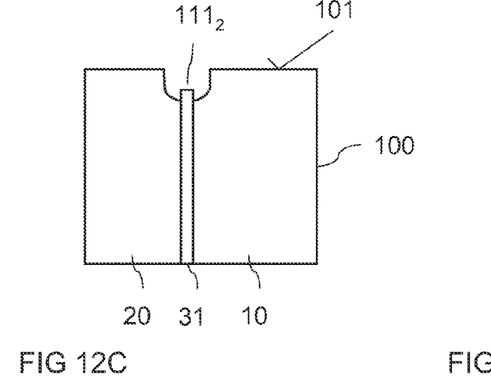

Another modification of the method illustrated in FIGS. 1A to 1F is explained next with reference to FIGS. 12A to 12H. In the method according to FIGS. 12A to 12H forming the first trench 111 does not only include removing a part of the first sacrificial layer 31, but also includes at least one isotropical etching process. After providing the semiconductor body with the first sacrificial layer 31 as shown in FIG. 12A a first section of the first trench 111₁ is formed by removing a part of the first sacrificial layer 31 in the region of the first surface 101 as shown in FIG. 12B. Referring to FIG. 12C, a second section 111₂ of the first trench 111 is formed by isotropically etching the semiconductor body 100 in the first section 111₁. Then, referring to FIG. 12D, a further part of the sacrificial layer 31 is removed below the second section 111₂, so that the first trench 111 is formed. This first trench 111 includes the second section 111₂ and a third section 111₃ obtained by removing the further part of the first sacrificial layer 31. The first trench 111 according to FIG. 12D is symmetrical relative to a vertical plane defined by the first sacrificial layer 31.

Figure 12D:
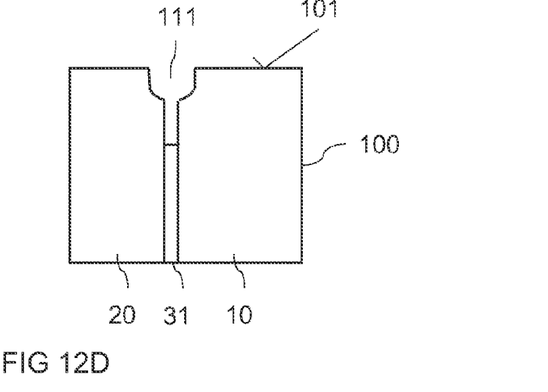

The first trench 111 of FIG. 12D, unlike the first trenches in the embodiments explained hereinbefore with reference to FIGS. 1A to 1F or 8A to 8F, is not only defined by a removed section of the first sacrificial layer 31 but is also defined by a first isotropical etching process. Consequently, the first trench 111 has a wider section in the region close to the first surface 111, and has a narrower section in a region more distant to the first surface 111. In the method according to FIGS. 12B to 12D the methods steps of removing a section of the first sacrificial layer 31, isotropically etching the semiconductor body 100, and removing a further section of the semiconductor 100 are performed once. However, these method steps could also be performed several times for generating first trench with several sections having different widths.

Figure 12E:
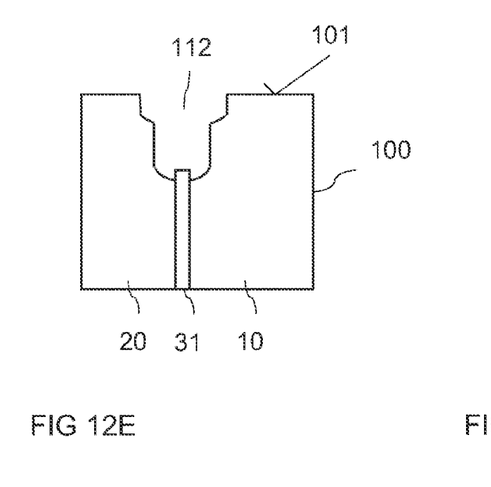
Figure 12F:
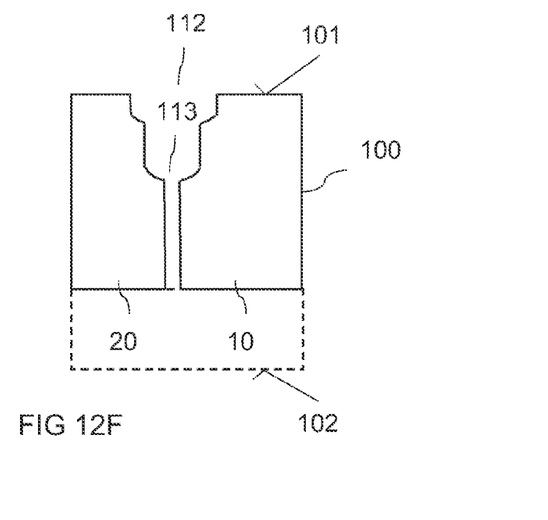
Figure 12G:
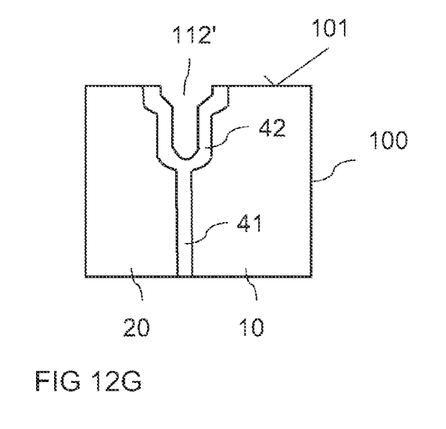
Figure 12H:
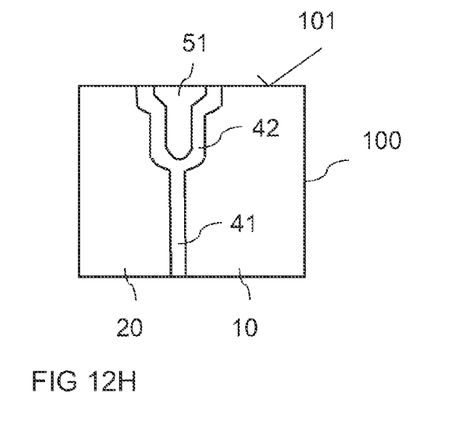

The method steps after forming the first trench 111 correspond to the method steps explained with reference to FIGS. 1C to 1F. These method steps include forming the section trench 112 by isotropically etching the semiconductor body 100 in the first trench 111 as shown in FIG. 12E. Partly or completely removing the first sacrificial layer 31 below the second trench 112 in order to form the third trench 113 as shown in FIG. 12F; forming the dielectric layer 40 in the third trench 113 and along the sidewalls of the second trench 112 as shown in FIG. 12G; and forming the gate electrode 51 as shown in FIG. 12H.

Referring to FIGS. 5 to 7 the gate electrode 51 of the MOSFET is connected to a gate terminal for applying a gate drive potential. For connecting the gate electrode 51 a contact pad or landing pad is required on the gate electrode 51 in the region of the first surface 111. This contact pad or landing pad can require a certain area larger than the area available on the gate electrode 51. However, it may not be desirable to completely implement the gate electrode 51 with a large area sufficient for a contact or a landing pad. FIGS. 13A to 13D illustrate a method for producing a gate electrode which includes a contact or landing pad. FIGS. 13A to 13G show top views on the first surface of the semiconductor body 100. This method will be explained based on the method according to FIGS. 1A to 1F. However, each of the other methods illustrated hereinbefore can be modified accordingly.

Figure 13A:
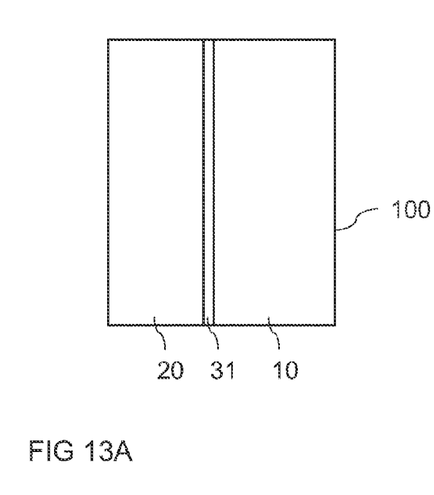
FIGS. 13A to 13G illustrate a further modification of the method illustrated in FIGS. 1A to 1F.
Figure 13B:
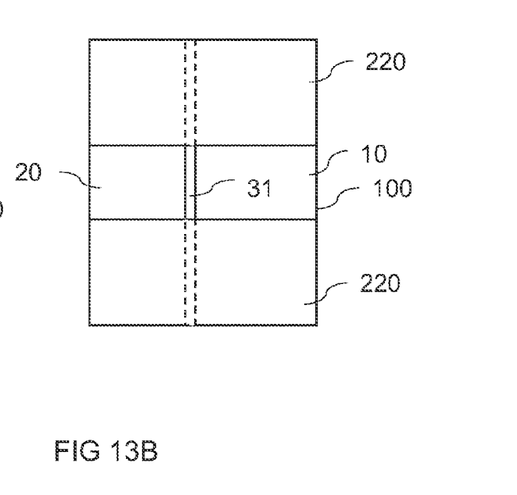
Figure 13C:
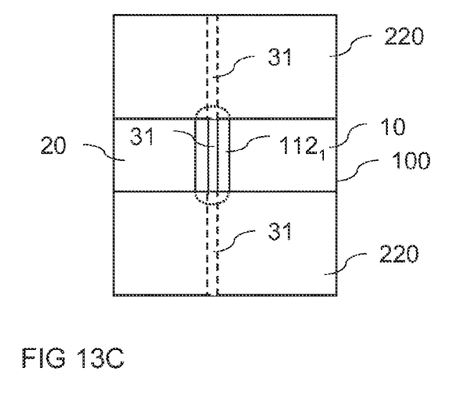

In this method, after providing the semiconductor body 100 with the first sacrificial layer 31 as shown in FIG. 13A, sections of the first surface 101 are covered by a mask layer 220. Referring to FIG. 13C a first section 112₁ of the second trench is formed in those regions of the semiconductor body 100 not covered by the mask layer 220. Forming the first section 112₁ of the second trench includes forming a first section of a first trench by partly removing the first sacrificial layer 31, and includes isotropically etching the semiconductor body 100 in the first section of the first trench. In FIG. 13C, reference number 31 denotes the sacrificial layer 31 which remains at or below the bottom of the first section 112₁ of the second trench.

During the isotropical etching process, the semiconductor body is also etched below the edges of the mask 220, so that the first section 112₁ of the second trench in its longitudinal direction slightly extends below the mask layer 220. This is illustrated in dotted lines in FIG. 13C.

Figure 13D:
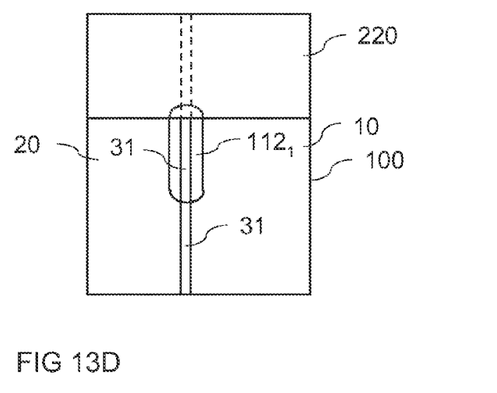
Figure 13E:
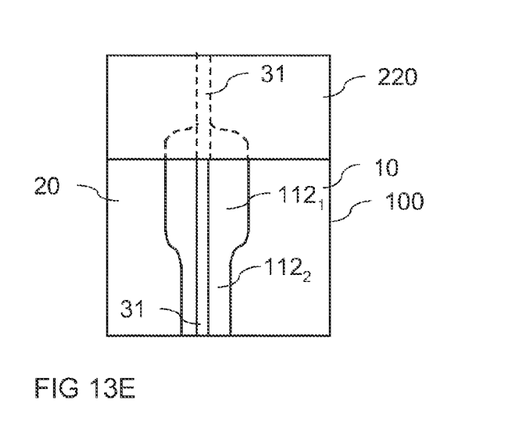

Referring to FIG. 13D the mask layer 220 or at least a part of the mask layer 220, is removed, so that a section of the first sacrificial layer 31 adjoining the first section 112₁ of the second trench in a lateral direction is uncovered. Referring to FIG. 13E, the first sacrificial layer 31 is partly removed in this section to form a second section of a first trench, and the semiconductor body is isotropically etched in the first section $112_1$ of the second trench and in the second section of the first trench, so as to form a second trench 112 which in the lateral direction has a varying width. When the sacrificial layer 31 is removed to form the second section of the first trench, also a part of the sacrificial layer at the bottom or below the bottom of the first section $112_1$ of the second trench is removed. During the etching process which follows the process of forming the second section of the first trench, the second section $112_2$ of the second trench is formed and the first section $112_1$ of the second trench becomes wider and deeper.

The second trench 112 illustrated in FIG. 13E has two trench sections with different trench widths: the wider and deeper first section $112_1$; and the narrower and shallower second section $112_2$.

Figures 13F, 13G:
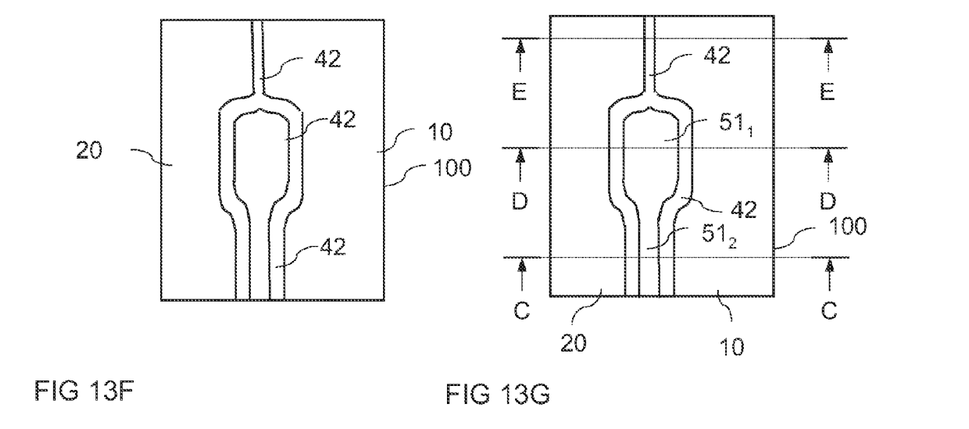

The remaining method steps, which are illustrated in FIGS. 13F and 13G, correspond to the method steps illustrated in FIGS. 1D to 1F. These method steps include removing the first sacrificial layer 31 below the second trench 112 and, forming the dielectric layer 42 as shown in FIG. 13F and forming the gate electrode as shown in FIG. 13G. The gate electrode has two gate electrode sections: A wider section $51_1$ which is formed in first section $112_1$ of the second trench, i.e. in that region of the semiconductor body which from the beginning was not covered by the mask layer 220; and a second section $51_2$, which is formed in the second section $112_2$ of the second trench, i.e. in a region which was at the beginning covered by the mask layer 220.

In the embodiment illustrated in FIGS. 13A to 13G sections of the semiconductor body and the first sacrificial layer 31 stay covered by the mask layer 220 during the method steps of forming the second trench 112, so that in those regions no trench is formed. This mask layer is removed before the method step of removing the sacrificial layer 31 below the second trench 112, so that the sacrificial layer 31 is also removed from this section to form a third section of the first trench. The dielectric layer 42 is also formed in this third section of the first trench, but no gate electrode is formed in this section.

Figures 14A, 14B:
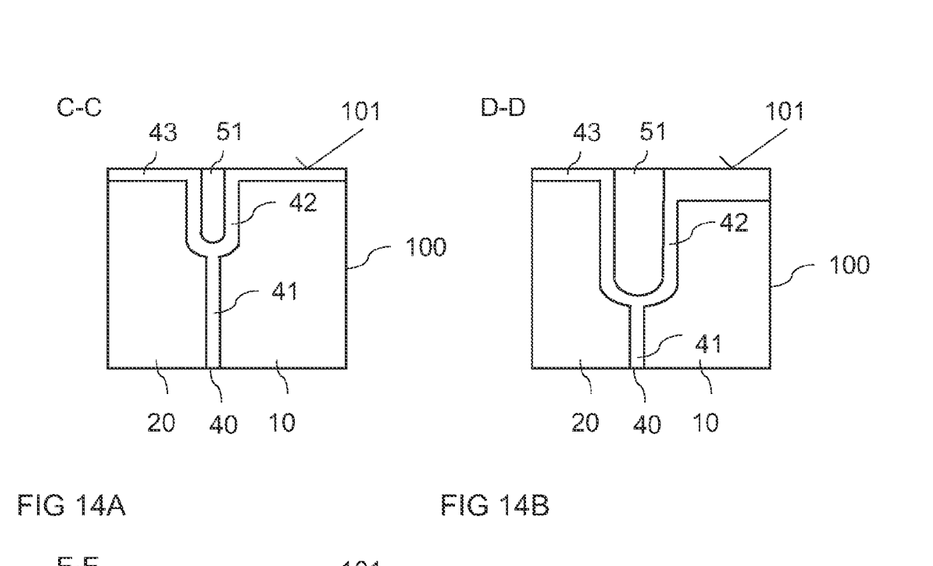
FIGS. 14A to 14C illustrate vertical cross sections through the structure illustrated in FIG. 13G.
Figure 14C:
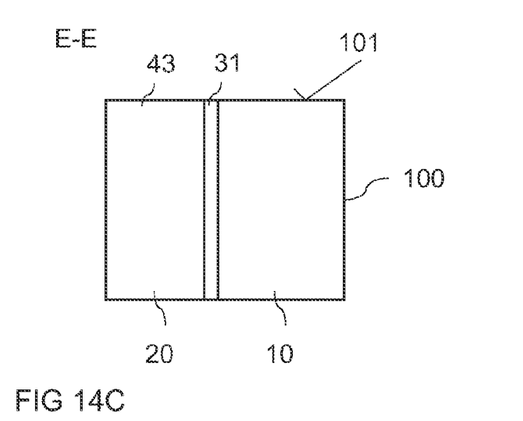

Vertical cross sections through the arrangement illustrated in FIG. 13G in section planes C-C, D-D and E-E are illustrated in FIG. 14A to 14C. Vertical section plane C-C cuts through the narrower second section $51_2$ of the gate electrode, section plane D-D cuts through the wider first section $51_1$ of the gate electrode, and section plane E-E cuts through an area in which no gate electrode has been formed. Finally, features which have been explained in connection with one embodiment can also be combined with features of other embodiments even when this has not explicitly been mentioned herein before.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for producing a transistor with a gate electrode structure, the method comprising:
   providing a semiconductor body with a first surface, and with a first sacrificial layer extending in a vertical direction of the semiconductor body from the first surface, the first sacrificial layer comprising a different material than the semiconductor body which can be removed or etched selectively relative to the semiconductor body;
   forming a first trench extending from the first surface into the semiconductor body, wherein forming the first trench comprises removing the sacrificial layer in a section adjacent the first surface;
   forming a second trench by isotropically etching the semiconductor body in the first trench;
   forming a third trench below the second trench by removing at least a part of the first sacrificial layer below the second trench;
   forming a dielectric layer which at least covers sidewalls of the third trench and which only covers sidewalls of the second trench; and
   forming a gate electrode on the dielectric layer in the second trench, the gate electrode and the dielectric layer in the second trench forming the gate electrode structure.

2. The method of claim 1, wherein the dielectric layer completely fills the third trench.

3. The method of claim 1, wherein forming the dielectric layer comprises one of depositing a dielectric layer and thermally growing a dielectric layer.

4. The method of claim 1, wherein forming the dielectric layer in the third trench comprises:
   forming a dielectric layer along the sidewalls of the third trench, leaving a residual trench; and
   filling the residual trench with a filling material.

5. The method of claim 4, wherein the filling material is a dielectric material.

6. The method of claim 1, wherein the first sacrificial layer includes an oxide layer, a nitride layer, a carbon layer or a germanium containing layer.

7. The method of claim 6, wherein the first sacrificial layer is a composite layer which includes at least two sublayers.

8. The method of claim 7, further comprising forming a semiconductor layer between two sublayers of the first sacrificial layer.

9. The method of claim 1, wherein forming the third trench comprises completely removing the first sacrificial layer.

10. The method of claim 1, wherein the semiconductor body further includes a second sacrificial layer adjacent the first sacrificial layer and extending in the vertical direction of the semiconductor body, the first sacrificial layer being removable or etchable selective to the second sacrificial layer.

11. The method of claim 10, wherein the second sacrificial layer includes a carbon layer, Germanium containing layer, an oxide layer, or a nitride layer.

12. The method of claim 11, wherein the first sacrificial layer is a composite layer which includes at least two sublayers.

13. The method of claim 12, further comprising forming a semiconductor layer between two sublayers of the first sacrificial layer.

14. The method of claim 10, further comprising removing the second sacrificial layer after forming the second trench and before forming the dielectric layer, wherein the second sacrificial layer is removed at least from the second trench and the third trench.

15. The method of claim 10, wherein forming the first trench includes:
   forming a first trench section by removing a part of the first sacrificial layer in a section adjacent the first surface;
   isotropically etching the semiconductor body in the first trench section to form a second section of the first trench; and
   removing the second sacrificial layer from the second trench section.

16. The method of claim 1, wherein forming the first trench comprises:
   removing a first section of the first sacrificial layer in a region below the first surface to form a first section of the first trench;
   isotropically etching the semiconductor body in the first section of the first trench;
   removing a second section of the first sacrificial layer in a region below the first section of the first trench to form a second section of the first trench; and
   isotropically etching the semiconductor body in the first and second sections of the first trench.

17. The method of claim 1, wherein forming the first trench comprises only removing the sacrificial layer in a section adjacent the first surface.

18. The method of claim 1, wherein the first sacrificial layer is arranged between a first semiconductor region and a second semiconductor region, and wherein the method further comprises:
   forming a body region of a first doping type in the first semiconductor region adjacent the gate electrode structure;
   forming a source region of a second doping type, which is complementarily to the first doping type, in the body region;
   forming a drift region in the first semiconductor region, the drift region adjoining the body region and adjoining the dielectric layer in a region below the gate electrode structure; and
   forming a source electrode connecting the body region and the source region.

19. The method of claim 18, wherein the drift region is of the second doping type.

20. The method of claim 18, wherein the drift region is of the first doping type.

21. The method of claim 18, wherein the drift region comprises:
   a first section of the first doping type adjacent the body region; and
   a second section of the second doping type, the second section adjoining the first section at a side opposite to the body region.

* * * * *